US008461046B2

(12) United States Patent
Vannier

(10) Patent No.: US 8,461,046 B2
(45) Date of Patent: Jun. 11, 2013

(54) PROCESS FOR PRODUCING A METALLIZATION LEVEL AND A VIA LEVEL AND CORRESPONDING INTEGRATED CIRCUIT

(75) Inventor: Patrick Vannier, Le Versoud (FR)

(73) Assignee: STMicroelectronics (Crolles 2) SAS, Crolles Cedex (FR)

( * ) Notice: Subject to any disclaimer, the term of this patent is extended or adjusted under 35 U.S.C. 154(b) by 0 days.

(21) Appl. No.: 13/187,326

(22) Filed: Jul. 20, 2011

(65) Prior Publication Data
US 2012/0018889 A1   Jan. 26, 2012

(30) Foreign Application Priority Data

Jul. 22, 2010   (FR) .................................... 10 55977

(51) Int. Cl.
*H01L 21/768* (2006.01)
(52) U.S. Cl.
USPC ............. 438/687; 257/E21.585; 257/E21.586
(58) Field of Classification Search
USPC ............ 438/618–688; 257/E21.575–E21.595
See application file for complete search history.

(56) References Cited

U.S. PATENT DOCUMENTS

| | | | |
|---|---|---|---|
| 6,333,560 B1 | 12/2001 | Uzoh | |
| 6,566,242 B1 * | 5/2003 | Adams et al. | 438/622 |
| 6,784,105 B1 * | 8/2004 | Yang et al. | 438/687 |
| 6,800,554 B2 * | 10/2004 | Marieb et al. | 438/687 |
| 7,169,700 B2 * | 1/2007 | Chang et al. | 438/637 |
| 7,335,588 B2 * | 2/2008 | Yang et al. | 438/638 |
| 7,585,768 B2 * | 9/2009 | Bu et al. | 438/678 |
| 2003/0008497 A1 | 1/2003 | Lin et al. | |
| 2005/0029659 A1 * | 2/2005 | Ko et al. | 257/750 |
| 2008/0079155 A1 | 4/2008 | Mule et al. | |
| 2010/0314764 A1 * | 12/2010 | Yang et al. | 257/751 |

FOREIGN PATENT DOCUMENTS

EP   0881673 A2   12/1998

OTHER PUBLICATIONS

French Search Report for FR 1055977 mailed Feb. 28, 2011.

* cited by examiner

*Primary Examiner* — Asok K Sarkar
*Assistant Examiner* — Eric Ward
(74) *Attorney, Agent, or Firm* — Gardere Wynne Sewell LLP

(57) ABSTRACT

A process for producing an upper metallization level and a via level connecting this upper metallization level to a lower metallization level includes: producing an insulating region on the lower metallization level; producing a hard mask on the insulating region (4, 5) defining the position of the via and metallic line of the upper metallization level; etching the insulating region through the hard mask so as to form a cavity; cleaning the cavity (which forms an undercut at the interface between the hard mask and the insulating region); and completely filling the cavity. The step of completely filling includes at least partially filling the cavity with copper and plugging the undercut. The undercut is plugged by sputtering a plugging material and forming an overlying doped copper layer.

10 Claims, 5 Drawing Sheets

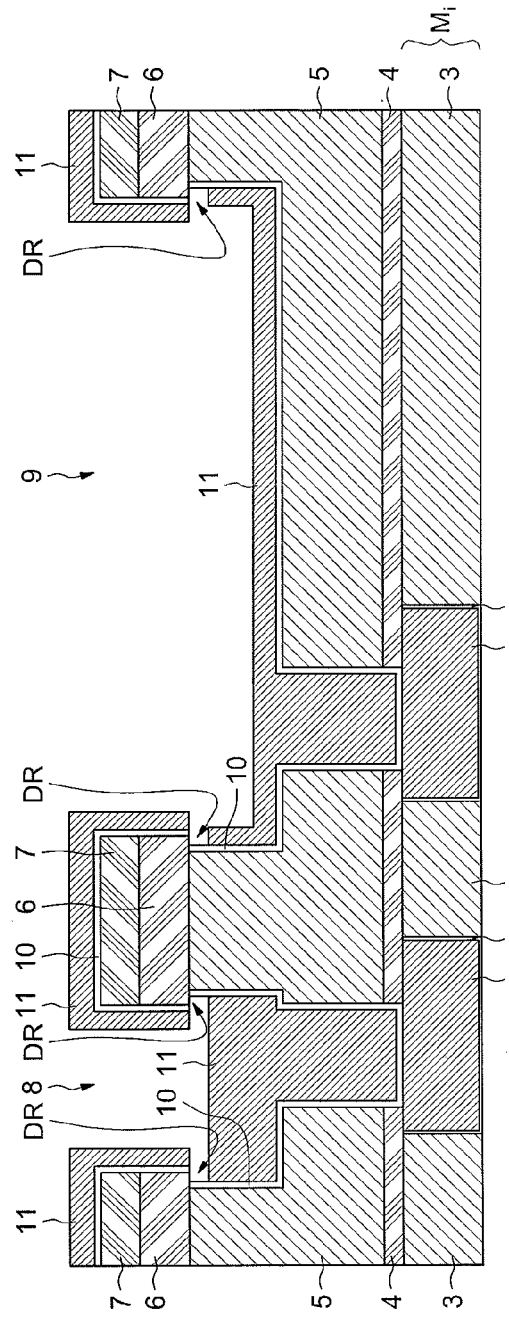
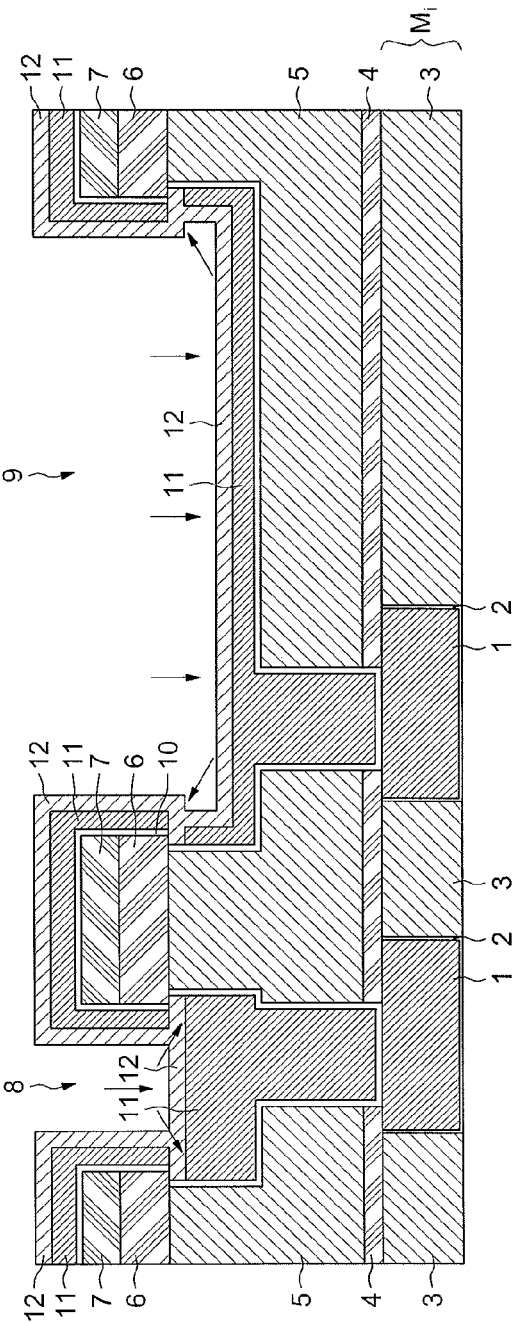
FIG.6
FIG.7

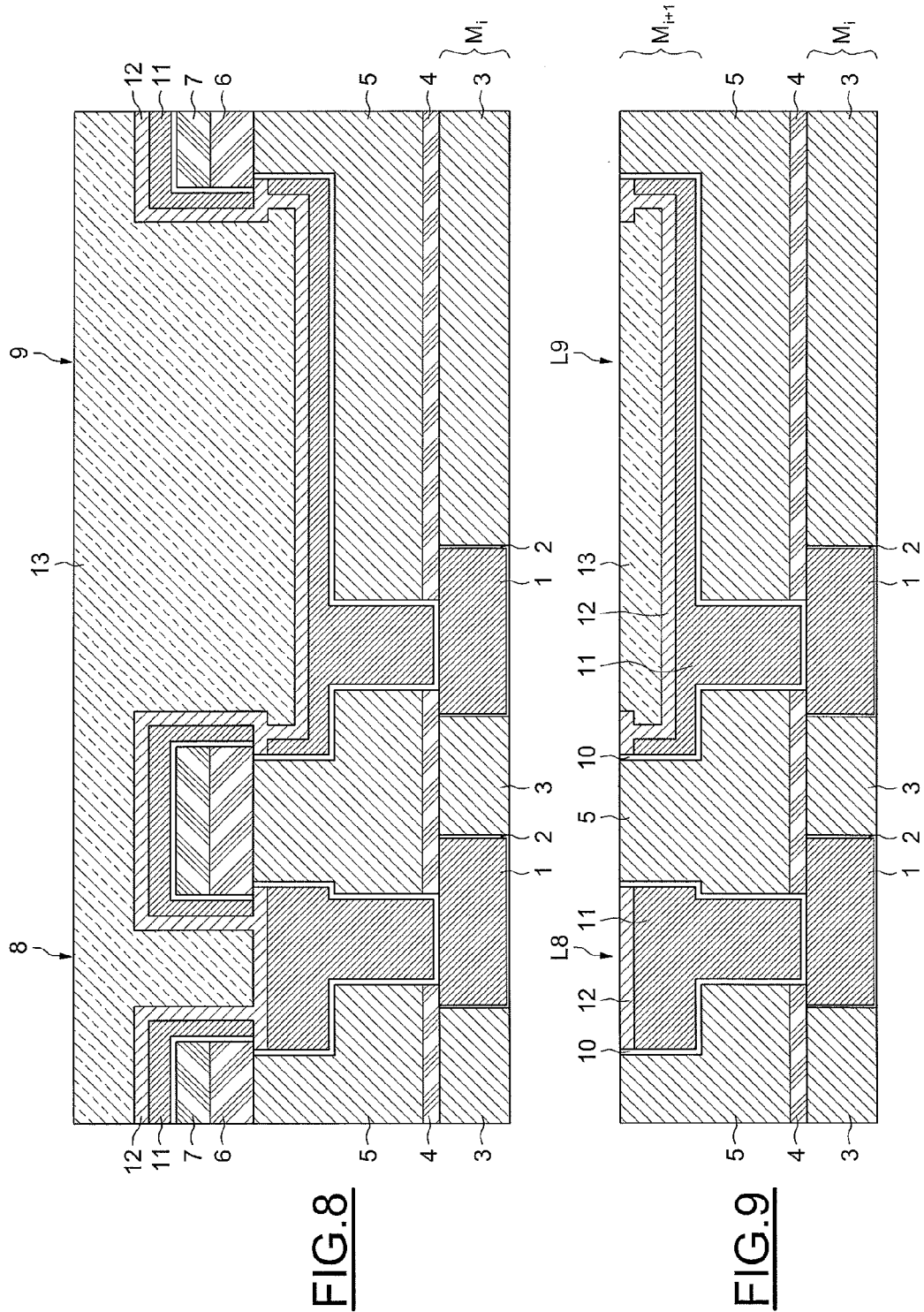

PROCESS FOR PRODUCING A METALLIZATION LEVEL AND A VIA LEVEL AND CORRESPONDING INTEGRATED CIRCUIT

PRIORITY CLAIM

This application claims priority from French Application for Patent No. 1055977 filed Jul. 22, 2010, the disclosure of which is hereby incorporated by reference.

TECHNICAL FIELD

The invention relates to integrated circuits and more particularly to the production of copper lines in metallization levels of the integrated circuit and of copper vertical interconnections or "vias" connecting two metallization levels.

BACKGROUND

In integrated circuits comprising copper lines, the lines in a metallization level and the vias connecting two metallization levels may be produced using the same process, known as a damascene process. More precisely, cavities defining both the vias and the lines of the metallization level to be produced are etched in an insulating region, the cavities produced opening onto the metallization level below. These cavities are then filled with copper, and a removal step, employing chemical-mechanical polishing, allows the excess copper and the hard masks used for the etching operation to be removed.

After the etching step defining the cavities, a cleaning operation is generally carried out using an oxygen plasma so as to remove polymer residues formed during the etching on the sidewalls of the cavities. This cleaning operation has the drawback of forming undercuts in the insulating region, at the interfaces between the insulating region and the various hard masks used. These undercuts may lead to fabrication defects during the deposition of copper in the cavities, or during the deposition of a tie layer for the copper. The tie layer for the copper is deposited for example by physical vapor deposition, which does not allow a continuous tie layer to be formed over the undercuts. The copper deposited on this tie layer may then consequently have holes where the undercuts are. These holes may lead to integrated circuits being obtained that are inoperable and therefore rejected during fabrication, to a reduced lifetime of the integrated circuit or even to a short circuit.

Apart from these problems related to the cleaning of the cavities using an oxygen plasma, faults may occur in the copper lines due to electromigration or the formation of protrusions on the surface of the lines.

In this regard it has been proposed to use a tie layer comprising doped copper to improve the ability of the copper to withstand electromigration, to improve the mechanical properties of the copper and to reduce the formation of protrusions and faults. The doped copper tie layer may contain atoms of aluminum, of manganese, of tin, magnesium, silver, titanium, indium, zirconium or molecules of molybdenum nitride, and is located on the bottom and side walls of the cavities.

This being so, the use of a doped copper layer has the drawback of increasing the resistance of the finest (i.e., narrowest) copper lines.

This increase in the resistance of the finest lines has consequences for the overall operation of the integrated circuit, possibly causing increased signal propagation delay times in these lines and a poor operation of the circuit at the desired frequencies.

SUMMARY

According to one method of implementation and embodiment, it is proposed to reduce the number of faults within copper lines in integrated circuits, especially by improving the filling of the cavities defining the metallic lines.

According to another method of implementation and embodiment, it is proposed to reduce the resistance of the finest copper lines.

According to one aspect, a process for producing a metallization level and a via level connecting this metallization level to a lower metallization level is provided. The process comprises producing an insulating region on the lower metallization level; producing a hard mask on the insulating region defining the positions of the vias and of the metallic lines of said metallization level; etching the insulating region through the hard mask so as to form cavities, at least some of which open onto said lower metallization level; cleaning the cavities, forming undercuts at the interface between the hard mask and the insulating region; and completely filling said cavities, including at least partially filling said cavities with copper and plugging the undercuts by sputtering a plugging material and forming a doped copper layer.

Thus, the partial filling of the cavities with copper means that the copper level obtained is located beneath the undercuts, thereby allowing the undercuts to be subsequently plugged. The sputtering contributes to filling the undercuts correctly.

This sputtering may be a sputtering of the surface of the copper that has partially filled the cavities. The plugging material is then copper. The doped copper layer is then formed after said plugging.

The plugging of the undercuts may comprise forming doped copper on the structure obtained after the partial filling of the cavities. This formation of the doped copper layer advantageously comprises depositing and sputtering doped copper.

This sputtering may result from a high-energy deposition of doped copper. The sputtering then occurs at the same time as the deposition. As a variant, the sputtering may be an operation separate from the deposition and after the latter. The plugging material is then doped copper.

The copper level obtained during the partial filling depends on the width of the cavities, and consequently on the width of the future metallic lines. Thus, depending on the width of the cavities, the complete filling of the latter may or may not be obtained with the subsequent deposition of doped copper that allows the undercuts to be filled.

Thus, according to one method of implementation, for at least one of the cavities, the formation of said doped copper layer allows this cavity to be completely filled. This is the case for fine lines.

The complete filling of the cavities may comprise, for at least one cavity, a final filling with copper on said doped copper layer. This is the case for wider lines.

Thus, the doped copper layer is located either on the top surface of certain lines, or at an intermediate level covered with copper so as to reach the required line thickness. The position of the doped copper layer depends on the height of the first copper deposition. For the widest lines, the height of this deposition is much lower than that reached in the finest lines.

Thus, a doped copper layer is not deposited in the bottom part of the vias and of the metallic lines, but on a first copper layer. It is thus possible to take advantage of the beneficial effects of the dopants on the faults, and to not substantially increase the resistance of the finest lines.

According to another aspect, an integrated circuit is provided comprising at least two metallization levels separated by a via level. Each metallic line of at least one of the metallization levels comprises, above a lower part made of copper, a doped copper layer extending at least partially along the top surface of said metallic line.

For at least one of said metallic lines, for example a fine (i.e., narrow) line, the doped copper layer may extend along the entire top surface of this metallic line.

For at least one of said metallic lines, for example a wide line, the doped copper layer is covered between its ends by a top part made of copper.

BRIEF DESCRIPTION OF THE DRAWINGS

Other advantages and features of the invention will become clear on studying the detailed description of methods of implementation and embodiments, given by way of non-limiting example, and illustrated by the appended drawings in which:

FIGS. 1 to 9 are views in cross section illustrating various steps in a method of implementing the process according to the invention, FIG. 9 furthermore illustrating a view in cross section of an embodiment of an integrated circuit according to the invention.

DETAILED DESCRIPTION OF THE DRAWINGS

Figure 1:
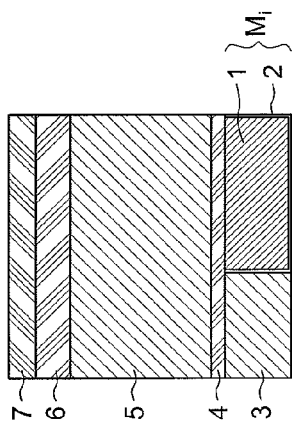

FIG. 1 is a view in cross section illustrating a copper line 1 in a first copper metallization level $M_i$. This line 1 is surrounded by an encapsulation layer 2 forming a barrier and tie layer, formed within a first insulating layer 3.

The encapsulation layer 2 may be formed from a first tantalum nitride layer allowing the diffusion of the copper into the silicon to be limited, a second tantalum layer allowing the copper to adhere, and a third copper layer (not shown) allowing the copper of the line 1 to be deposited by electrolysis. The layers of tantalum nitride, of tantalum and of copper in the encapsulation layer 2 were, for example, deposited using conventional physical vapor deposition (PVD) steps.

The first insulating layer 3 here is a porous low-permittivity $SiO_xC_y$ dielectric layer. The addition of a pore-forming agent during the formation of the first insulating layer 3 allows air cavities to be induced, which reduce the permittivity of the first insulating layer 3.

A barrier layer 4 preventing vertical diffusion is deposited on the first metallization level 1, the encapsulation layer 2 and the first insulating layer 3. The barrier layer 4 is for example an $SiC_xN_y$ layer.

A second insulating layer 5 is deposited on the barrier layer 4. The second insulating layer 5 is similar to the first insulating layer 3, it is a porous low-permittivity $SiO_xC_y$ dielectric layer.

The barrier layer 4 and the second insulating layer 5 together form an insulating region within which the future cavities will be etched.

A first hard mask 6 is deposited on the second insulating layer 5. The first hard mask 6 is for example a tetraethyl orthosilicate layer.

A second hard mask 7 is deposited on the first hard mask 6. The second hard mask 7 is for example a titanium nitride layer.

Figure 2:
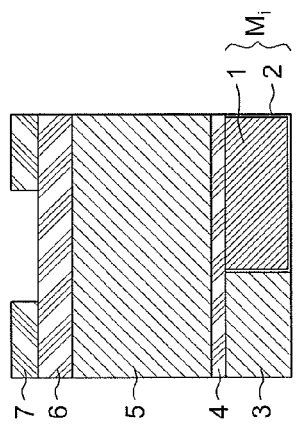

In FIG. 2, the second hard mask 7 is etched in a photolithography step for defining the positions of the lines. This photolithography step comprises using a mask (not shown) to allow selective etching of the titanium nitride of the second hard mask 7.

Figure 3:
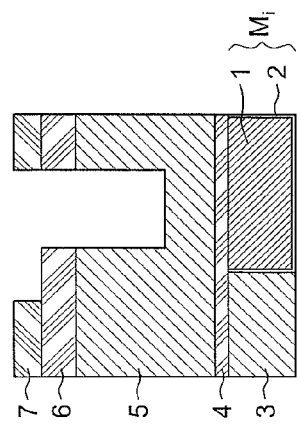

A second photolithography step is used to define the positions of the vias in the first hard mask 6 (FIG. 3). This photolithography step comprises the use of a mask (not shown). The hard mask 6 is etched, and then anisotropic dry etching partially defines the cavities forming the vias. The selective anisotropic dry etching etches the second insulating region 5 but does not etch the two hard masks 6 and 7.

Figure 4:
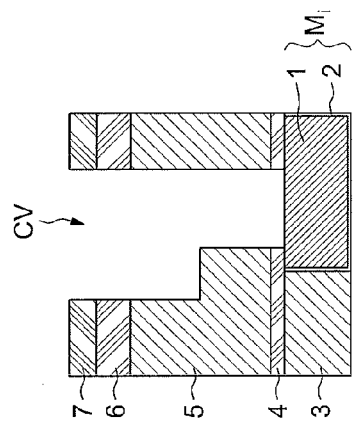

The production of the cavities continues by etching and over-etching of the layer 4 so that the cavities CV open onto the lower metallization level $M_i$ (FIG. 4).

Figure 5:
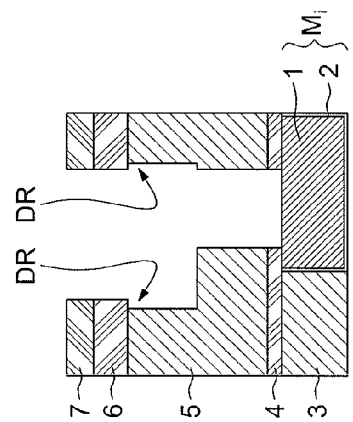

The various anisotropic dry etchings use various chemical elements which may form a polymer layer on the walls of the vias and lines. This polymer layer is removed before depositing a metal into the cavities formed. Cleaning with an oxygen plasma is carried out to remove the polymer layer. During the cleaning, part of the walls, which are formed by the second insulating layer 5, is partially consumed so as to form undercuts DR at the interface between the hard mask and the insulating region (FIG. 5).

FIG. 6 is a view in cross section illustrating two types of cavity 8 and 9 of different sizes formed in accordance with the steps shown in FIGS. 1 to 5.

The cavity 8 is associated with a fine (narrow) line in an integrated circuit and a via associated with this line. The fine lines may have widths between 40 and 90 nanometers.

The cavity 9 is associated with a wide line in an integrated circuit and a via associated with this line. The wide lines may have widths greater than 1 micron.

An encapsulation layer 10 forming a barrier and tie layer is deposited on the walls of the cavities 8 and 9. This encapsulation layer 10 has the same properties as the encapsulation layer 2: it is composed of a tantalum nitride layer, a tantalum layer and a copper layer. This encapsulation layer 10 was deposited using physical vapor deposition steps. Physical vapor deposition does not allow a uniform layer to be deposited in the cavities and around the hard mask element 6 and 7. Thus, discontinuities may appear where the undercuts DR are, at the interface between the hard mask and the insulating region.

A first copper layer 11 is deposited in the cavities 8 and 9. This copper layer partially fills the cavities 8 and 9. The finer cavity 8 is filled to a higher level than the filling level of the cavity 9. The filling level of the cavities is below the interface between the hard mask 6 and the insulating region 5.

A person skilled in the art will know how to choose the copper deposition parameters, taking into consideration the dimensions of the cavities, so as to obtain, for the finest cavities, a copper level 11 lying beneath the undercuts DR.

A doped copper layer 12 is then deposited (FIG. 7) on the copper layer 11. The doped copper layer 12 is deposited so as to plug the undercuts DR. Thus, the layer 12 is uniform relative to the underlying structure. To obtain the uniformity, the step of forming the doped copper layer 12 comprises depositing and sputtering the doped copper.

The doped copper layer 12 is advantageously deposited by cathode sputtering. The copper atoms and the dopants contained in a target are sputtered using an argon plasma and then deposited on the first copper layer 11.

In a first method of implementing the invention, the deposition of the doped copper layer 12 is followed by a step of sputtering the doped copper 12. More precisely, an argon plasma sputters the surface of the doped copper 12 so as to free copper atoms and dopants which are deposited in the undercuts DR.

In a second method of implementation, the deposition of the doped copper layer 12 is carried out under a sinusoidal bias of about 200 W to 1000 W coupled using coils to a radiofrequency bias of about 1000 W to 2000 W. The energy of the copper atoms and dopants torn from the target is sufficient to deposit and sputter copper atoms and dopants so as to form the doped copper layer 12 and plug the undercuts. The doped copper tie layer 12 may contain atoms of aluminum, of manganese, of tin, magnesium, silver, titanium, indium, zirconium or molecules of molybdenum nitride.

The thickness of the layer 12 will be adjusted depending on the space remaining between the layer 11 and the hard mask so as to plug the undercuts DR. Typically this thickness is between 5 nm and 15 nm.

The two methods described allow the undercuts in the cavity 8 and the cavity 9 to be filled.

The formation of the metallic line and the via of the cavity 8 is complete. The doped copper layer 12 is located on the surface of the metallic line. This configuration allows the effect of the dopants on the resistance of the finest lines to be limited, and benefits from improvements due to the dopants on the surface of the finest lines.

The formation of the metallic line and the via of the cavity 9 is incomplete, but the doped copper layer 12 is uniform where the undercuts are.

In FIG. 8, a second copper layer 13 is deposited in an electrolysis step on the doped copper layer 12. The doped copper layer 12 is uniform and allows a uniform deposition of the copper layer 13 by electrolysis.

The formation of the metallic line in the cavity 9 is completed by this step. The doped copper layer 12 here is located at mid-height in the cavity 9, and the metallic line benefits from improvements due to the dopants preventing faults.

The resistance of the widest lines such as the metallic line of the cavity 9 does not substantially increase due to the introduction of dopants. This is because the width of these lines allows negligible resistance to be obtained, even after dopants have been introduced.

FIG. 9 is a view in cross section illustrating a subsequent step in the formation of the lines and vias. To remove the hard masks 6 and 7 and the excess copper 13, and to planarize the surface of the metallization level created, a chemical-mechanical polishing step is employed. This step removes all the materials deposited above the top of the metallic lines.

For the finest lines of the metallization level $M_{i+1}$ thus formed, such as the metallic line L8, the top of the line is formed entirely by the doped copper layer 12.

For the widest lines, such as the metallic line L9, the top of the line is formed at the ends by a portion of the layer 12 and by the second layer copper 13. The middle part of the layer 12 is covered by the layer 13.

Thus metallic lines and vias are obtained which do not include filling defects at the interfaces between the hard masks 6, 7 and the insulating layer 5. Metallic lines are also obtained that have fewer faults such as electromigration or the formation of protrusions on the surface of the lines.

In addition to a reduced number of faults, fine lines, having a width between 40 and 90 nanometers, are also obtained that have a low resistance.

For the sake of clarity and simplicity, the steps of a method of implementing the process according to the invention have been described for the production of one metallization level $M_{i+1}$ only. This being so, these steps may be applied to any other metallization level in which undercuts are present under hard masks employed during the production of these metallization levels.

Figure 10:
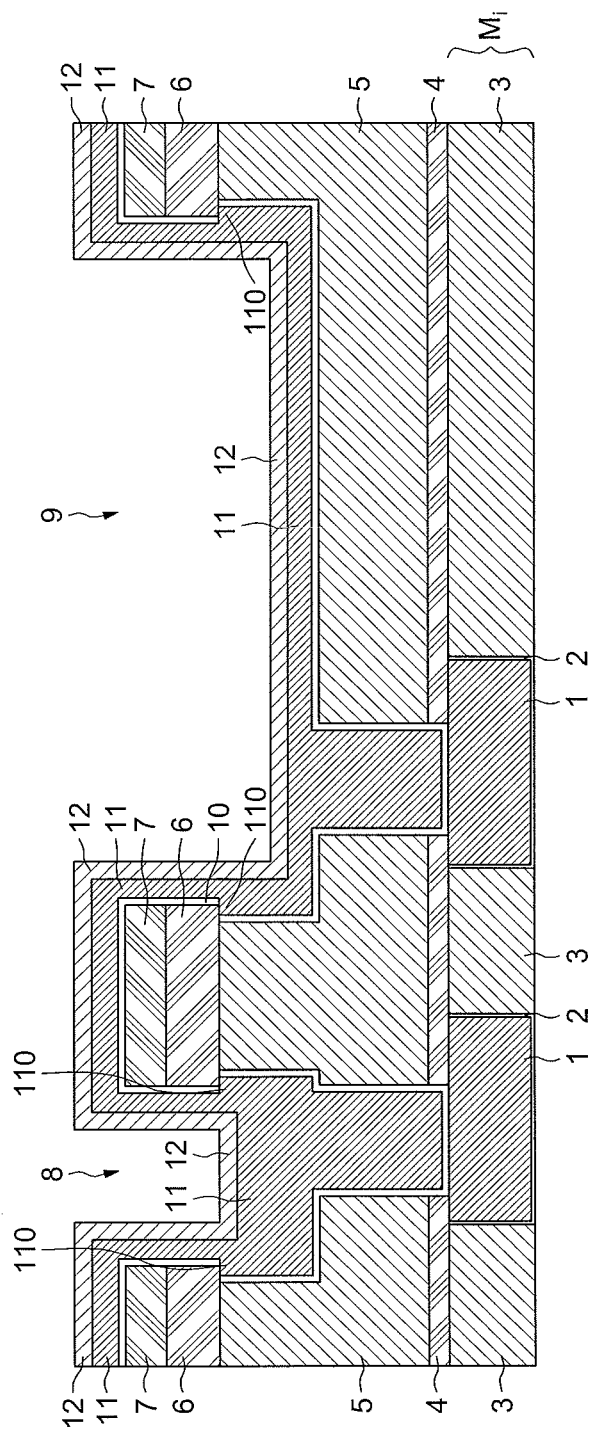
FIGS. 10 to 12 illustrate another method of implementation and embodiment of the invention.
Figures 11, 12:
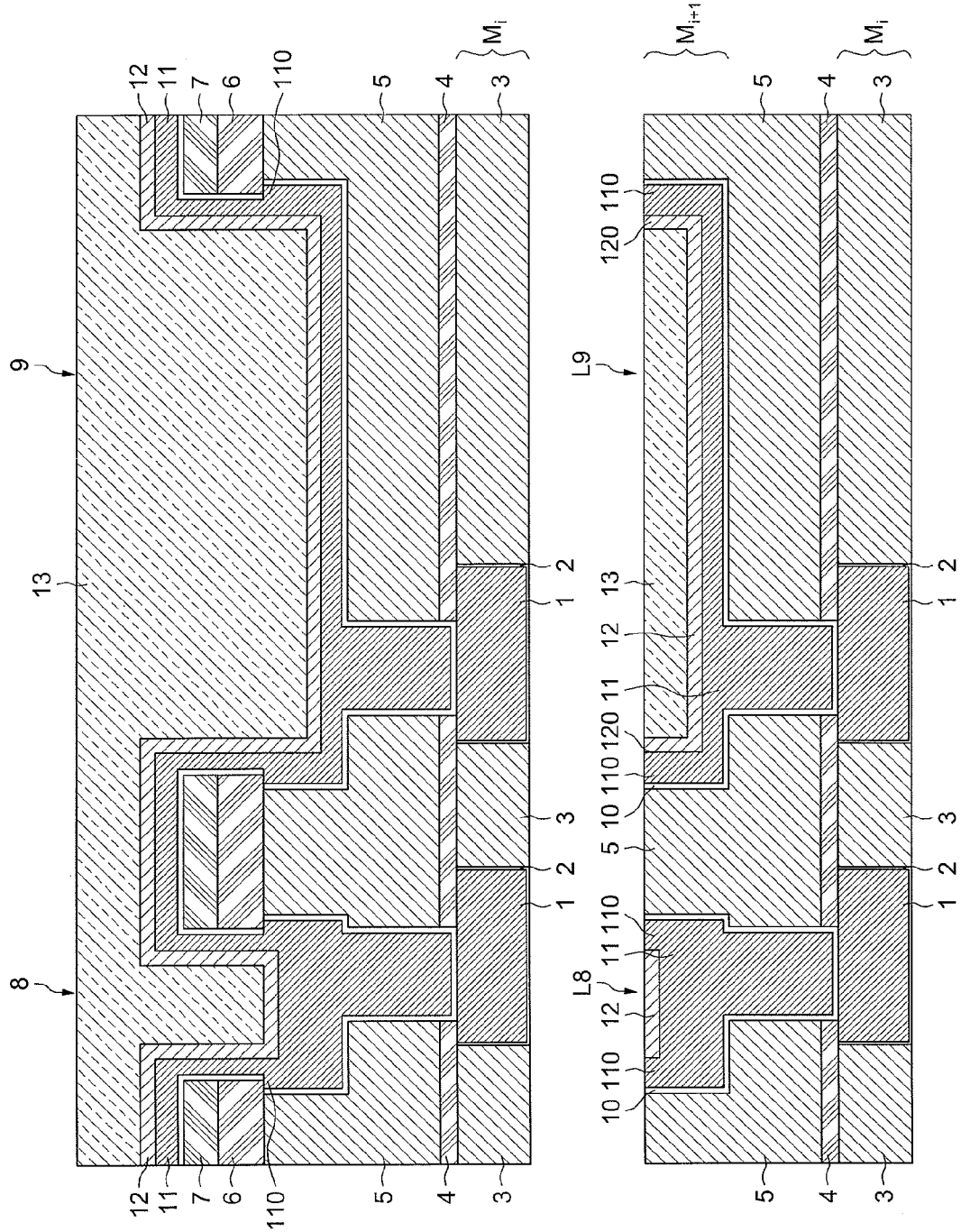

It should be noted that the invention is not limited to the methods of implementing the process which have just been described but includes all the variants. It is especially possible, as illustrated in FIG. 10, to sputter the copper layer 11 before the doped copper layer 12 has been deposited. This allows the undercuts DR to be plugged with undoped copper atoms 110. The doped copper layer 12 then will not extend into the undercuts. This layer 12 is then simply deposited without sputtering. The steps following those illustrated in FIGS. 11 and 12 are analogous to those described with reference to FIGS. 8 and 9.

For the device obtained (FIG. 12), as regards the narrow lines, this results in a doped copper layer 12 extending partially along the top surface of the metallic line (except at the ends 110 which correspond to the position of the undercuts DR), and for the wide lines, a small portion of doped copper 120 which remains on the surface (beside the positions of the undercuts (DR)).

What is claimed is:

1. A process, comprising:
   producing an insulating region on a lower metallization level;
   producing a hard mask on the insulating region defining the positions of vias through the insulating region and of metallic lines of an upper metallization level;
   etching the insulating region through the hard mask so as to form cavities, at least some of which open onto said lower metallization level;
   cleaning the cavities, where said cleaning forms an undercut at an interface between the hard mask and the insulating region;
   partially filling said cavities with copper along sidewalls of said cavities such that the partially filling copper is not formed on upper portions of the sidewalls of the cavities at the undercut and underside of the hard mask at the undercut; and
   sputtering a doped copper layer on the upper portions of the sidewalls of the cavities and underside of the hardmask so as to plug the undercut.

2. The process according to claim 1, wherein sputtering comprises sputtering the surface of the copper that has partially filled said cavities.

3. The process according to claim 1, wherein, for at least one of the cavities, the sputtering of said doped copper layer results in a complete filling of said cavity.

4. The process according to claim 1, further comprising completely filling the cavities with copper on said doped copper layer.

5. The process according to claim 1, further comprising removing the hard mask after completely filling the cavities.

6. A process, comprising:
   producing an insulating layer;
   producing a hard mask on the insulating layer, the hard mask having a mask opening defining a position of a metal line;
   etching the insulating layer through the hard mask so as to form a cavity in the insulating layer;
   cleaning the cavity, where said cleaning forms an undercut region at an interface between the hard mask and the insulating layer;
   partially filling the cavity with copper along sidewalls of said cavity such that the partially filling copper is not formed on upper portions of the sidewalls of the cavity at the undercut and underside of the hard mask at the undercut region; and
   depositing a doped copper layer over the copper fill, the doped copper layer filling the undercut region.

7. The process of claim 6, further comprising: removing the hard mask and defining a top surface of the metal line, wherein that top surface is defined by the doped copper layer.

8. The process of claim 6, further comprising: depositing additional copper over the doped copper layer; removing the hard mask and defining a top surface of the metal line, where that top surface is defined by both the doped copper layer and the additional copper.

9. A process, comprising:
producing an insulating region over a metallization level;
etching the insulating region through a mask so as to form a cavity extending to said metallization level;
cleaning the cavity, where said cleaning forms an undercut portion in the insulating region at an interface between the mask and the insulating region;
partially filling said cavity, wherein partially filling comprises partially filling the cavity with copper along sidewalls of said cavity such that the partially filling copper is not formed on upper portions of the sidewalls of the cavity at the undercut portion, and
plugging the undercut portion by sputtering a plugging material doped copper in the cavity on the upper portions of the sidewalls at the undercut portion.

10. A process, comprising:
producing an insulating layer;
defining a position of a metal line with a mask layer on the insulating layer;
etching the insulating layer through the mask layer so as to form a cavity in the insulating layer;
cleaning the cavity, where said cleaning forms an undercut region at an interface between the mask layer and the insulating layer;
partially filling the cavity with copper along sidewalls of said cavity such that the partially filling copper is not formed on upper portions of the sidewalls of the cavity at the undercut region; and
depositing a doped copper layer over the partial copper fill, the doped copper layer filling at least the undercut region and covering the upper portions of the sidewalls of the cavity at the undercut region.

* * * * *